United States Patent
Yu et al.

(10) Patent No.: US 6,307,282 B1
(45) Date of Patent: Oct. 23, 2001

(54) SMART SWITCH

(75) Inventors: David Yu, Pompano Beach; Charles B. Swope, Coral Springs; Michael J. Macaluso, Sunrise, all of FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/455,328

(22) Filed: Dec. 6, 1999

(Under 37 CFR 1.47)

(51) Int. Cl.[7] .................................................. H01H 35/00
(52) U.S. Cl. ............................................. 307/119; 307/121
(58) Field of Search ............................. 307/119–121, 116

(56) References Cited

U.S. PATENT DOCUMENTS

| | | | | |
|---|---|---|---|---|
| 5,184,120 | * | 2/1993 | Schultz | 340/870.38 |
| 5,500,635 | * | 3/1996 | Mott | 340/323 R |
| 5,691,580 | * | 11/1997 | Shelby | 307/119 |
| 5,969,440 | * | 10/1999 | Young et al. | 307/119 |
| 6,208,271 | * | 3/2001 | Armstrong | 341/34 |

OTHER PUBLICATIONS

Load Cell Instruction, & Selection Manual, Entran International, Entran Devices, Inc., Feb. 1985, 10 Washington Avenue, Fairfield N.J. 07006.

* cited by examiner

*Primary Examiner*—Fritz Fleming
(74) *Attorney, Agent, or Firm*—Frank M. Scutch, III

(57) ABSTRACT

A smart switch produces a signal responsive to movement of said switch between a first state and a second state. The said switch has a first state position and a second state position. The switch can be moved from said first state to said second state responsive to a force applied to said switch. The switch includes a transducer, such as a load cell, that is responsive to said force for producing a transducer signal indicative of the force applied to said switch. The transducer signal is indicative of the amount of movement of said switch from said first state to said second state.

18 Claims, 4 Drawing Sheets

SMART SWITCH

BACKGROUND

Fast acting switches, which are light in weight and responsive to a light touch or pressure, such as a popple switch, are widely used in applications where those features are considered an advantage. One such application is in portable devices such as wireless communication devices. These popple and other similar switches may be used to perform an on/off function, one example being to turn on the microphone in a transmitter or to turn on the transmitter. In the operation of a switch, a hundred milliseconds or more may elapse between the time the switch begins to move to its "on" state and the time the function is activated by the switch. This elapsed time goes unused and other functions cannot be started until the switch is connected in its "on" state and the device is made to proceed through its preprocessing functions preliminary to the start of the main function.

SUMMARY OF THE INVENTION

According to the inventive principles as disclosed in connection with the preferred embodiment, a smart switch is made to sense applied pressure or force which progressively increases as the switch is moved from its "off" state to its connected or "on" state. For example, in the case of a popple switch, where the force applied to the switch moves one contact surface mounted on a resilient means such as a spring means, against another forming an electrical connection, a force sensing device is used to sense the increasing force applied to the switch and the deflection or displacement of the switch as its contact surfaces move toward each other to the final connection state.

In the case of a switch, such as a popple switch, for example, where a resilient means is employed that produces an increasing counter force responsive to movement of the switch between states, several milliseconds may elapse between the time a force is first applied to the switch and the moment when the "on" state is reached when full contact is made. This elapsed time may be used to start components which must be active in their functioning state before the device can perform its main function or to perform functions in a device which are required before the device is in its full "on" state or to turn a device fully on so it is ready when the switch is in its "on" in the event the operator desires to immediately use the device, such as a transmitter for example.

For example in a radio, it may be necessary to turn on several components before the transmitter can be used to transmit a message. Because it is in the nature of switches to require a time period to elapse starting with the time force is applied to the switch to place it in its "on" state, this time may be used by sensing the changing state of the switch to initiate functions or start components needed to "warm up" the unit before it can fully function. The term "warm up" is used in a descriptive sense to indicate the element of elapsed time require to fully start a device by first starting components in the device or completing a start procedure, such as for example "booting" as that term is known and understood in connection with computers.

According to the inventive principles as disclosed in connection with the preferred embodiment, a strain gauge is used within a switch to sense the force applied to the switch. In the case of a disclosed embodiment, as increasing force is applied, the popple switch deflects causing the popple switch contacts to move toward each other, producing a counter force. As the popple switch deflects under the applied force, a strain gauge attached to the popple switch deflects responsively providing a continuous indication of the switch position and an indication that the switch is moving between or from its "off" state to its "on" state. This continuous indication may be in the form of an analog signal produced responsive to the deflection of the strain gauge and the increasing force applied to the resilient popple switch. By reading or sensing the analog signal, an indication of the instant position of the switch may be obtained as it is being moved between states, such as between its off and on states. This indication may be translated into a start signal to initiate pre-start functions or procedures, which are required for full operation, and which are pre-started during the elapsed period of time when the switch is being moved between states.

According to the inventive principles as disclosed in connection with the preferred embodiment, the smart switch may be ergonomically customized to the individual user by using a receptor which senses the analog output of the switch and provides a signal responsive to the position or deflection of the switch as it is undergoing a change in state. In this way the smart switch could be made more responsive to a light force or light touch to produce a signal at the start of its change of state when the force applied may be the lightest and the deflection the smallest and where a maximum amount of time is required to pre-start the components to warm up the device so all needed components are fully functioning when the full operation of the device is demanded.

BRIEF DESCRIPTION OF THE PREFERRED EMBODIMENT

Figure 1:
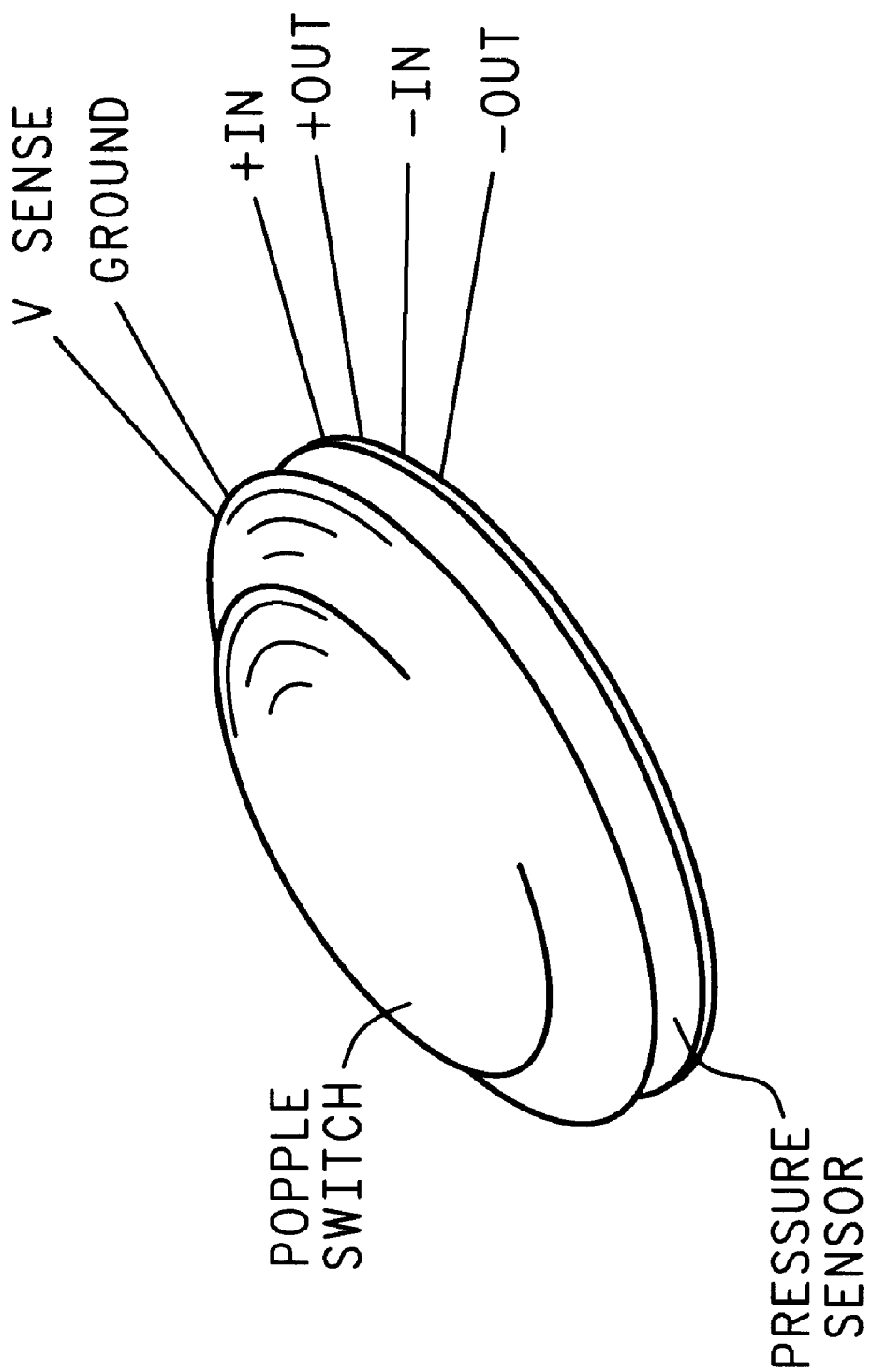
FIG. 1 shows in a preferred embodiment of the disclosed invention, a popple switch with a pressure sensor such as a strain gauge used to measure the force applied to the switch.

A switch such as a popple switch made according to the principles of the disclosed invention is shown in FIG. 1. Although a popple switch is disclosed, it should be understood that any switch which is deflected or moved form one state to another may be used according to the inventive principles. The popple switch, which is otherwise similar to any other popple switch as would be known to one of ordinary skill in the art, has, according to the disclosed invention, a built in pressure or force sensor such as a load cell, which are readily available and which are capable of measurements down to 0.25 lbs. The electrical connections to the load cell within the disclosed embodiment senses a continuous analog signal output "V sense" as increasing force is applied and the popple switch contacts are pressed toward each other.

An increasing force is being applied to the switch, the load cell undergoes a proportional deflection as would be known to one of ordinary skill in the art, and produces a continuous output signal. That signal is indicative of the force applied to the switch and the state of the switch deflection. The mounting of the load cell and the electrical connection to a load cell, such as for example a load cell mounted in a switch such as a popple switch, would be understood by one of ordinary skill in the art. Accordingly, the specific details of that mounting and connection are not elaborated herein.

Figure 2:
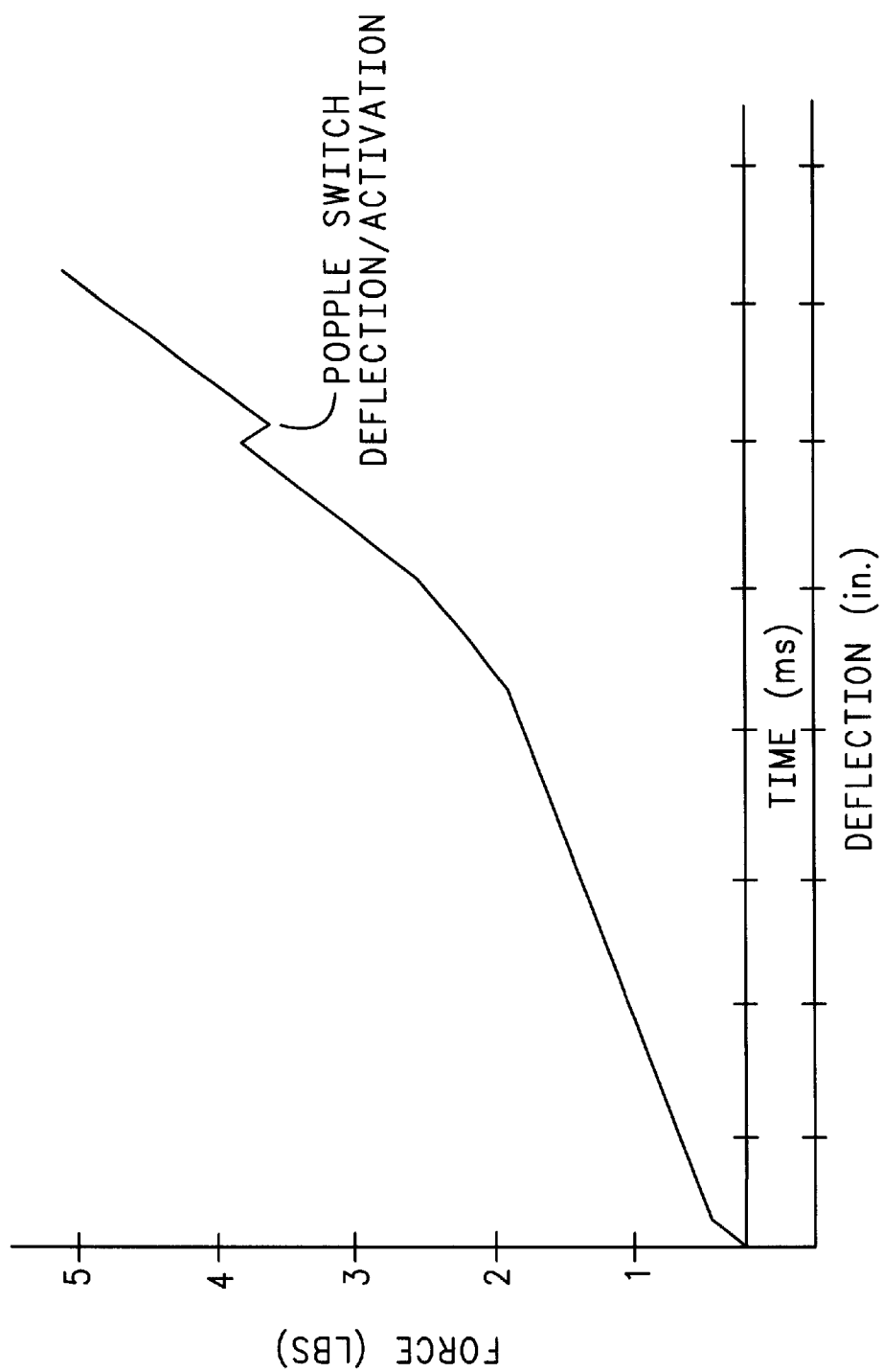
FIG. 2 shows the elapsed time between the time force is applied to the switch and the time the switch is fully connected, and the deflection of the switch, compared to the force applied to the switch.
Figure 3:
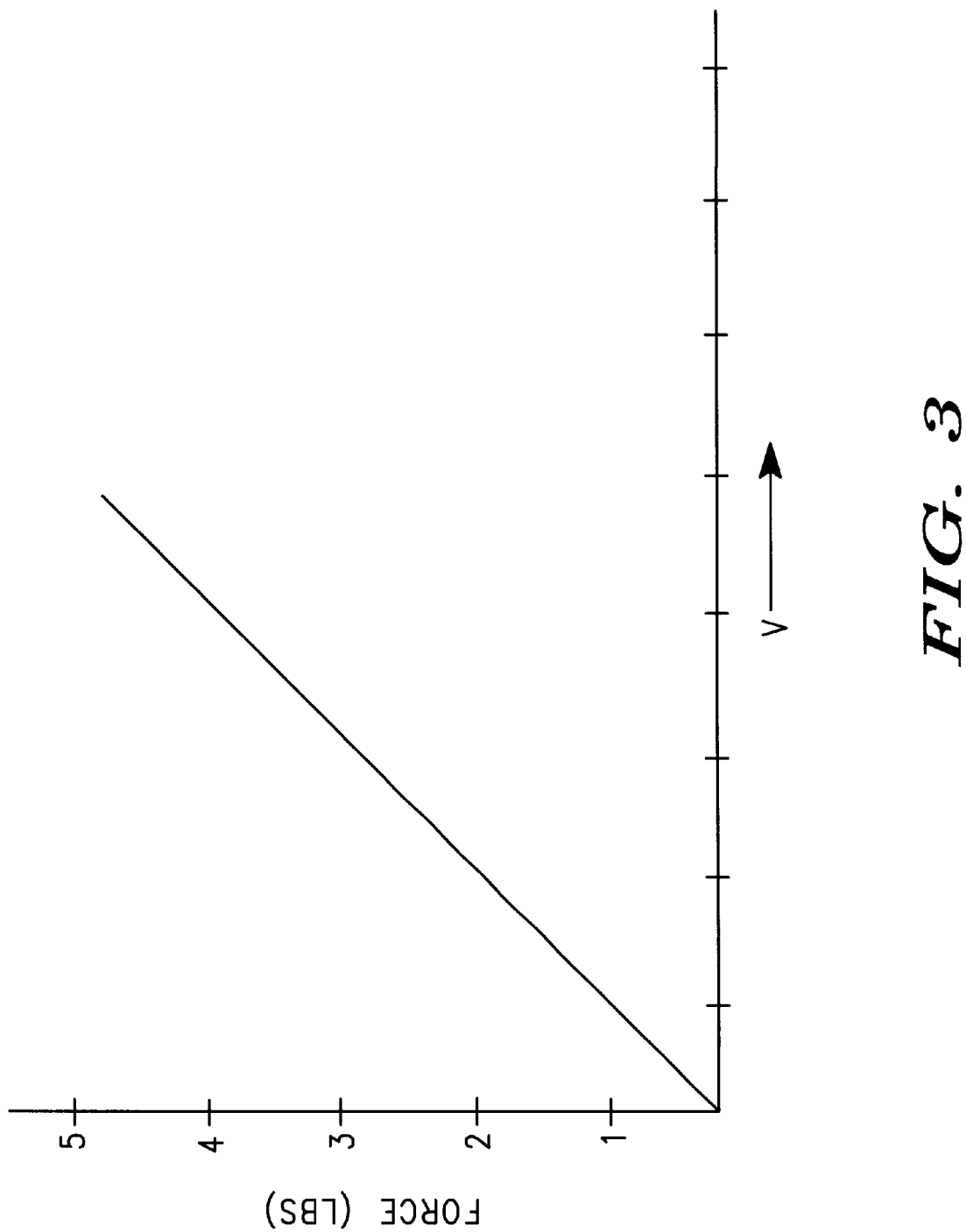
FIG. 3 shows an analog signal which may be produced from the switch of FIG. 1, compared to the force applied to the switch.

In FIG. 2 is shown the elapsed time between the time that the force is applied to the switch and the time the switch is fully connected and the deflection, compared to the force applied to the switch. As shown, an increasing force may be applied to the switch over time, taking, for example, 300 milliseconds before the switch fully changes state. During that time, the switch will undergo a responsive deflection. Where a load cell or other device responsive to deflection is mounted in the switch, a proportional change in output voltage is produced as shown in FIG. 3.

Figure 4:
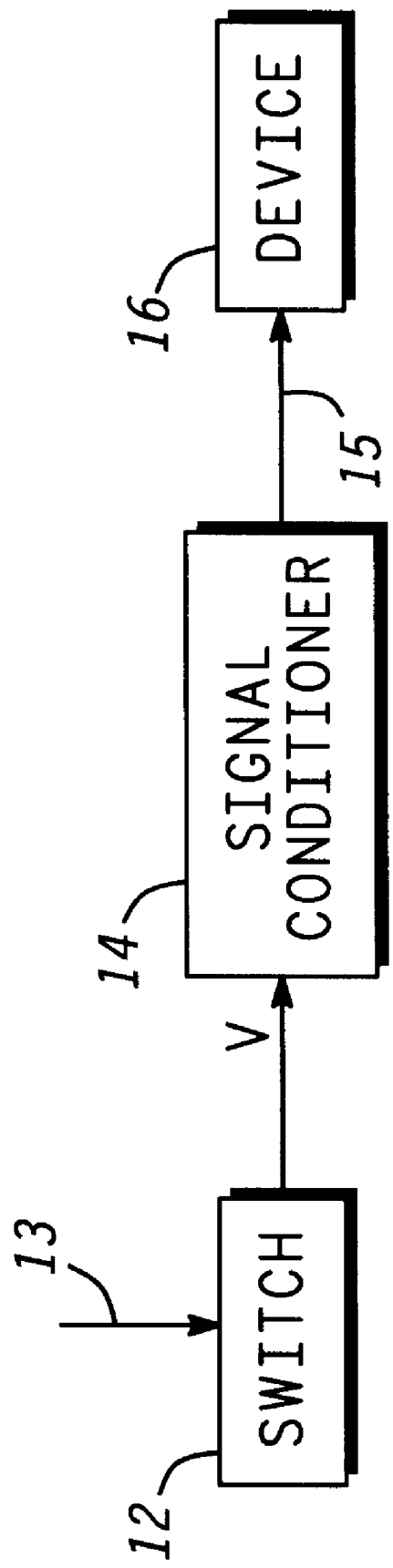
FIG. 4 shows a system which may be connected to sense the analog signal produce by the switch in response to a continuous force and how that signal may be used to restart functions of components required for the full on state of the device.

As shown in FIG. 4, a system 11 may be connected to sense the analog signal produced by the switch in response to a continuous or increasing force. The analog signal may be used to start functions or components required for the full on state of the device, or to start components sequentially. The system 11 can use the output of the switch to make a device and its restart operations and functions responsive to the amount of force applied the switch or to the rate of change in the movement of the switch between its states. The system is shown generally by FIG. 4 as having a switch 12, made with a transducer according to the inventive principles as disclosed. The output of the switch 12 is an analog signal as shown in FIG. 3 produced responsive to the deflection of the switch over time as shown in FIG. 2. The level of the output signal V may be sensed by signal conditioner 14, which may be used to produce one or more start signals on line 15 to device 16. These start signals may be coded or on separate lines, to restart the device by starting functions or components necessary for the operation of the device or to warm up the device. The elements of this kind of signal conditioner would be well known to those of ordinary skill in the art and for that reason are not disclosed.

In addition, as the switch changes state over time its rate of change may be sensed by signal conditioner 14 and used to control the restart functions of device 16. For example, in an emergency, a fast rise in V indicating an emergency, could be used to jump start the device 16, by skipping some functions or components, as might be expected in an emergency condition. The signal conditioning may be performed by computer operation according to a software program, as would be know to one of ordinary skill in the art. For example, the signal placed on line 15 could be made responsive to a level of force as indicated by a voltage level V' on line 17. The signal conditioner could produce start signals on line 15 by learning the user's touch. For example, the signal conditioner 15 could be programmed to record a range of forces applied by a user and to select a threshold level for V or a threshold rate of change. For example, the range of the level of force applied to the switch over time or over a predetermined number of uses could be used to produce a threshold level for producing a control signal responsive to that threshold level. Similarly, the same process could be used for producing a control signal responsive to the rate of change of the switch between states.

Another adaptation can include producing sequential control signals in response to the continuous transducer output signal changing in level, for separately operating selected components. Other adaptations can include producing a "startup" control signal as described above in response to a first voltage from the transducer and producing an "ON" control signal in response to a second voltage from the transducer that is indicative of a force greater than that required to normally achieve the ON state of the switch. This provides a backup "closure" detection in the event the normal closure of the switch is broken. This detection can require not only the second voltage being detected, but may also require the second voltage being sensed for a predetermined time, for example, 1 or 2 seconds, indicative of a fervent attempt by an operator to achieve an ON state of a function or a state that is long lasting, such as a Push-to-Talk state. Although specific embodiments of the invention have been disclosed, it will be understood by those having ordinary skill in the art that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A smart switch for producing a signal responsive to movement of said switch between a first state and a second state, comprising:
    a switch having a first state and a second state;
        said switch being moved from said first state to said second state responsive to a force applied to said switch;
        said switch including a transducer responsive to said force for producing a transducer signal indicative of the force applied to said switch; and wherein,
        said transducer signal is indicative of the amount of movement of said switch, from said first state to said second state; and
    wherein said switch is moved from said first state to said second state at a rate of movement responsive to the amount of said force applied to said switch; and said transducer signal is indicative of rate of movement of said switch from said first state to said second state.

2. The smart switch of claim 1, including a signal processor coupled to said transducer signal for producing a control signal responsive a predetermined level of said transducer signal indicative of said amount of movement of said switch from said first state to said second state.

3. The smart switch of claim 2, wherein said transducer signal is continuous over a range and said signal processor includes means for producing said control signal responsive to a predetermined level in said range.

4. The smart switch of claim 3, wherein said signal processor for producing said control signal includes means for producing said control signal responsive to said range established for a predetermined period of time.

5. The smart switch of claim 3, wherein said signal processor means for producing said control signal includes means for producing said control signal responsive to said range established for a predetermined number of said transducer signals.

6. The smart switch of claim 1, including a signal processor coupled to said transducer signal for producing a control signal responsive a predetermined level of said transducer signal indicative of said rate of movement of said switch from said first state to said second state.

7. The smart switch of claim 1 wherein said switch includes at least one contact mounted in a resilient means.

8. The smart switch of claim 1, wherein said transducer is a load cell and wherein said load cell deflection is responsive to an increasing force.

9. The smart switch of claim 1, wherein said transducer signal is a continuous analog signal and including a signal processor coupled to said transducer for producing a plurality of control signals responsive to changes in said transducer signal.

10. A radio responsive to the movement of a switch from a first position to a second position for controlling separate functions of said radio responsive to the amount of movement of said switch in moving from said first position to said second position, comprising:

a plurality of components separately operable in response to separate respective control signals;

said radio having a fully operational state when said components are each made operable; and at least a first of said components is made operable in response to a second of said components being made operable;

a switch having a first state and a spaced apart second state and being moved from said first state to said second state responsive to a force applied to said switch;

said switch including a transducer responsive to said force producing a transducer signal indicative of the force applied to said switch and the amount of movement of said switch from said first state to said second state;

a signal processor connected to said transducer for producing said separate respective control signals and produces a signal indicative of the rate of said movement of said switch from said first state to said second state; and wherein, said separate respective control signals are produced sequentially in response to said movement of said switch.

11. The radio of claim 10, wherein said switch includes a resilient means producing a counter force proportional to said force applied to said switch; and said transducer signal is indicative of the force applied to said switch.

12. The radio of claim 11 wherein movement of said switch from said first state to said second state requires an increasing force level to overcome said counter force and the level of said transducer signal is indicative of said force level.

13. The radio of claim 12, wherein said signal processor produces a control signal in response to a predetermined force level that is indicative of a force greater than that normally required to achieve the second state of the switch.

14. The radio of claim 13, wherein said control signal is produced in response to the predetermined force being sensed for a predetermined time.

15. The radio of claim 10, wherein said transducer comprises a load cell.

16. The smart switch of claim 10 wherein said transducer signal is continuous over a range and said signal processor includes means for producing said control signal responsive to a predetermined level in said range.

17. The smart switch of claim 16, wherein said signal processor means for producing said control signal includes means for producing said control signal responsive to said range established for a predetermined period of time.

18. The smart switch of claim 16 wherein said signal processor means for producing said control signal includes means for producing said control signal responsive to said range established for a predetermined number of said transducer signals.

* * * * *